(12) United States Patent
Seki

(10) Patent No.: US 10,971,448 B2
(45) Date of Patent: Apr. 6, 2021

(54) SWITCHING DEVICE

(71) Applicant: Murata Manufacturing Co., Ltd., Kyoto (JP)

(72) Inventor: Kenta Seki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/549,376

(22) Filed: Aug. 23, 2019

(65) Prior Publication Data
US 2019/0378792 A1 Dec. 12, 2019

Related U.S. Application Data

(63) Continuation of application No. PCT/JP2018/002821, filed on Jan. 30, 2018.

(30) Foreign Application Priority Data

Feb. 28, 2017 (JP) .............................. JP2017-036960

(51) Int. Cl.
*H01L 23/00* (2006.01)
*H01L 23/528* (2006.01)
(Continued)

(52) U.S. Cl.
CPC ............ *H01L 23/528* (2013.01); *H01L 23/50* (2013.01); *H01L 23/66* (2013.01); *H01L 2223/6605* (2013.01)

(58) Field of Classification Search
None
See application file for complete search history.

(56) References Cited

U.S. PATENT DOCUMENTS

2003/0016071 A1 1/2003 Nagano et al.
2005/0093646 A1 5/2005 Tsukahara et al.

FOREIGN PATENT DOCUMENTS

JP H08-213472 A 8/1996
JP 2003-17991 A 1/2003
(Continued)

OTHER PUBLICATIONS

International Search Report for International Application No. PCT/JP2018/002821 dated Mar. 20, 2018.
(Continued)

*Primary Examiner* — Reema Patel
(74) *Attorney, Agent, or Firm* — Pearne & Gordon LLP

(57) ABSTRACT

A switching device includes first to third layers laminated in sequence above a principal surface of a substrate, a plurality of input terminals, a plurality of output terminals, a plurality of switching circuits, and a plurality of channels. Each of the channels electrically connecting one of the plurality of input terminals and one of the plurality of output terminals with one of the plurality of switching circuits interposed therebetween. The plurality of channels include a first channel and a second channel that intersect with each other when the principal surface of the substrate is seen in a plan view. In an intersection area where the first and second channels intersect with each other, the first channel is disposed on the first layer, the second channel is disposed on the third layer, and none of the plurality of channels is disposed on the second layer.

5 Claims, 6 Drawing Sheets

(51) Int. Cl.
*H01L 23/50* (2006.01)
*H01L 23/66* (2006.01)

(56) References Cited

FOREIGN PATENT DOCUMENTS

| | | | | |
|---|---|---|---|---|
| JP | 2005-136630 A | 5/2005 | | |
| JP | 2010-74025 A | 4/2010 | | |
| JP | 2010-154337 A | 7/2010 | | |
| JP | 2015-005947 A | 1/2015 | | |
| JP | 2015005947 | * | 1/2015 | ............... H01P 1/15 |
| WO | 2012/039073 A1 | 3/2012 | | |

OTHER PUBLICATIONS

Written Opinion for International Application No. PCT/JP2018/002821 dated Mar. 20, 2018.

\* cited by examiner

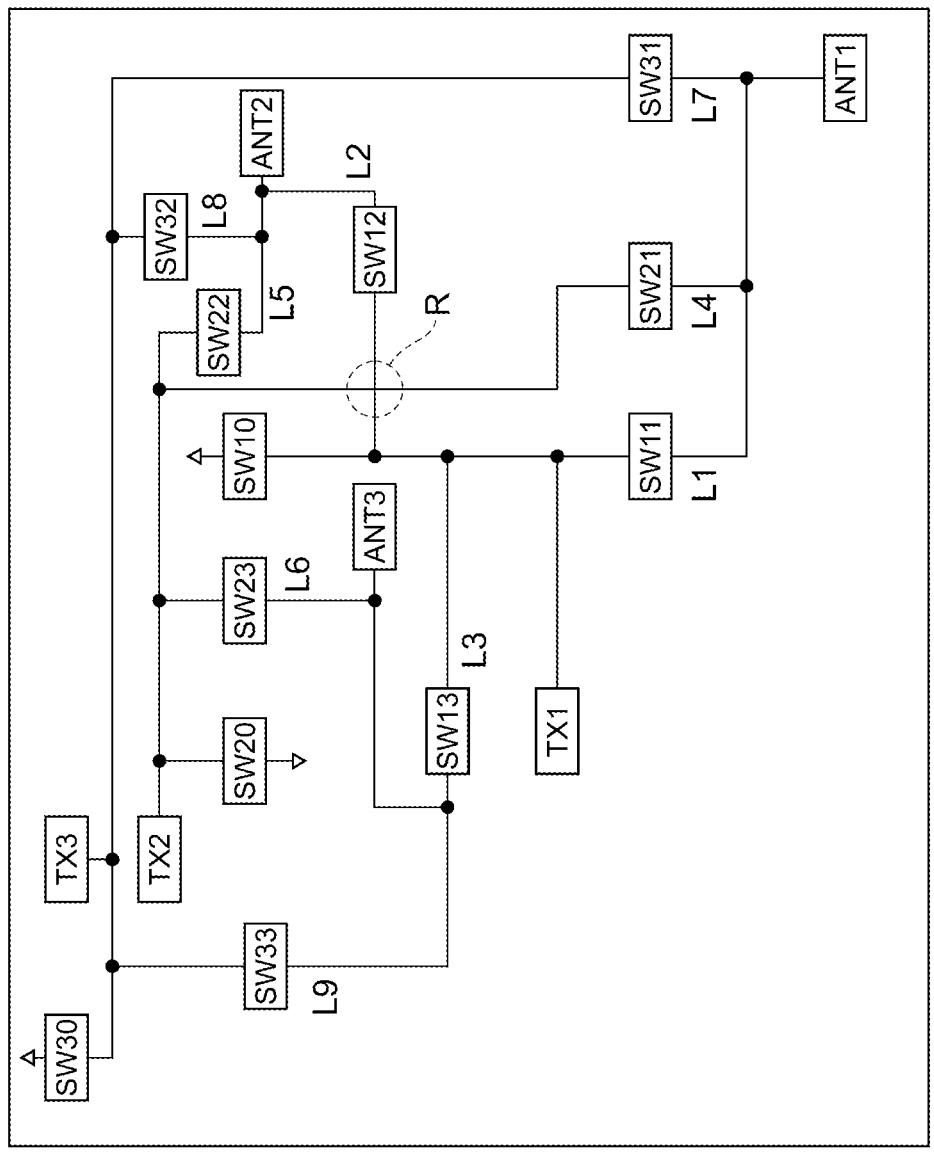
FIG. 4
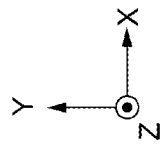

SWITCHING DEVICE

This is a continuation of International Application No. PCT/JP2018/002821 filed on Jan. 30, 2018 which claims priority from Japanese Patent Application No. 2017-036960 filed on Feb. 28, 2017. The contents of these applications are incorporated herein by reference in their entireties.

BACKGROUND OF THE DISCLOSURE

Field of the Disclosure

The present disclosure relates to a switching device.

Description of the Related Art

Wireless communication systems, including a wireless local area network (LAN), are required to support transmission and reception of signals in a plurality of kinds of communication standards (multiple modes) and signals in a plurality of kinds of frequency bands (multiple bands). Such an apparatus supporting multiple modes and multiple bands needs to include a plurality of transmission and reception circuits and antennas supporting the modes and the bands and switching circuits that switch a channel between the transmission and reception circuits and the antennas in accordance with the modes and bands. One such example device is a multi-terminal semiconductor switch with a single input terminal and multiple output terminals or with multiple input terminals and a single output terminal disclosed in Patent Document 1. This multi-terminal semiconductor switch adopts a layout where wires connected to individual terminals is routed to a single shared node and thus the distance between the shared node and each of the individual terminals has the shortest equal length.

Patent Document 1: Japanese Unexamined Patent Application Publication No. 2010-74025

BRIEF SUMMARY OF THE DISCLOSURE

In recent years, multiple-input and multiple-output (MIMO), in which different data units are simultaneously transmitted from a plurality of antennas and different data units are combined at the time of reception, has been increasingly introduced. In a device supporting MIMO, a plurality of channels between the transmission and reception circuits and the antennas may be used simultaneously. Accordingly, routing the plurality of wires to a shared node, as in the switch disclosed in Patent Document 1, is impossible, and channels connecting the plurality of input terminals and the plurality of output terminals, respectively, are needed.

Here, if the number of input terminals and output terminals is increased, the wires constituting the channels may intersect in multiple metal layers laminated on or above a semiconductor substrate. In the intersection area of the wires, there is a problem that the electric power of signals may be decreased by a parasitic capacitance occurring between the metal layers and the insertion loss in the switch may increase.

In the light of the above-described circumstances, it is an object of the present disclosure to provide a switching device capable of suppressing an increase in insertion loss.

To achieve the object, a switching device according to an aspect of the present disclosure includes first to third layers laminated in sequence on or above a principal surface of a substrate, a plurality of input terminals, a plurality of output terminals, a plurality of switching circuits, and a plurality of channels. Each of the channels electrically connecting one of the plurality of input terminals and one of the plurality of output terminals via one of the plurality of switching circuits. The plurality of channels include a first channel and a second channel that intersect with each other when the principal surface of the substrate is seen in a plan view. In an intersection area where the first and second channels intersect with each other, the first channel is disposed on the first layer, the second channel is disposed on the third layer, and none of the plurality of channels is disposed on the second layer.

The present disclosure can provide a switching device capable of suppressing an increase in insertion loss.

BRIEF DESCRIPTION OF THE SEVERAL VIEWS OF THE DRAWINGS

FIG. 4 schematically illustrates an example of a layout of the switching device according to the embodiment of the present disclosure.

DETAILED DESCRIPTION OF THE DISCLOSURE

Figure 1:
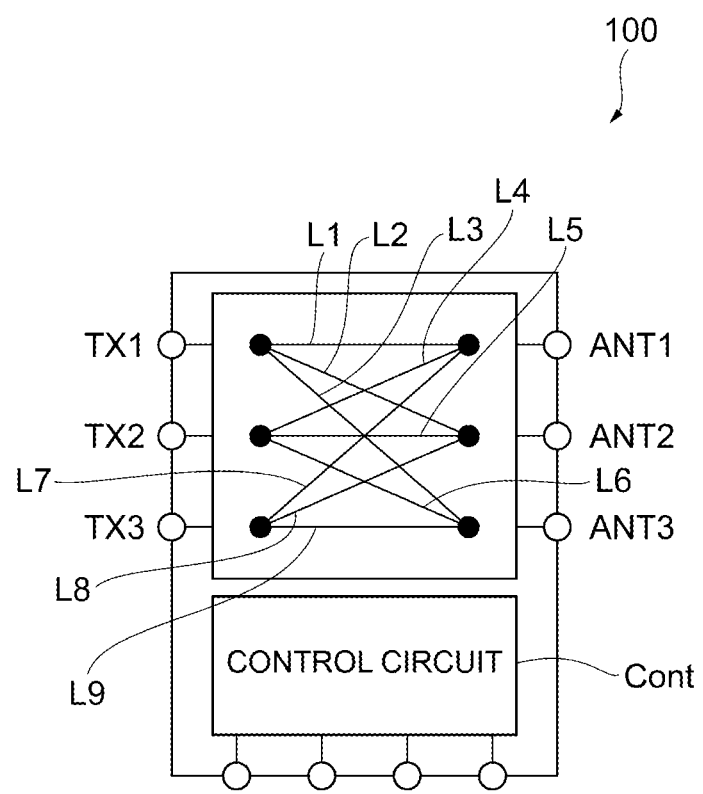
FIG. 1 schematically illustrates an example configuration of a switching device according to an embodiment of the present disclosure.

An embodiment of the present disclosure is described below with reference to the drawings. The same elements have the same reference numerals, and redundant description is omitted.

FIG. 1 schematically illustrates an example configuration of a switching device according to an embodiment of the present disclosure. A switching device 100 illustrated in FIG. 1 may be incorporated in an apparatus, such as a cellular phone supporting wireless data communications, for example, wireless LAN and Bluetooth (registered mark) communications, and is used for outputting a transmission signal inputted from a transmission circuit to any one of antennas. In the present specification, the switching device 100 is described as being applied to a configuration that transmits transmission signals. The switching device 100 is also applicable to a configuration that supplies reception signals received from antennas to reception circuits.

The switching device 100 may also be incorporated in an apparatus supporting, for example, multiple modes and multiple bands and MIMO and may also be applied in cases where different signals are simultaneously transmitted from a plurality of antennas. The case where the switching device constitutes a 3-pole 3-throw (3P3T) switch is described below as an example. The numbers of input terminals, output terminals, and channels described are merely examples and do not limit the present disclosure. The number of input terminals and that of output terminals may be the same or different.

As illustrated in FIG. 1, the switching device 100 may include, for example, three input terminals TX1 to TX3, three output terminals ANT1 to ANT3, nine channels L1 to L9, and a control circuit Cont. In FIG. 1, switching circuits for switching conduction of the channels are omitted.

The input terminals TX1 to TX3 receive transmission signals from transmission circuits (not illustrated). The transmission signals may be radio-frequency (RF) signals whose frequencies are on the order of, for example, several GHz. The output terminals ANT1 to ANT3 supply transmission signals supplied through the channels L1 to L9 to antennas (not illustrated). The channels L1 to L9 electrically connect the input terminals TX1 to TX3 and the output terminals ANT1 to ANT3 via the switching circuits (not illustrated). In other words, each of the channels electrically connecting one of the plurality of input terminals and one of the plurality of output terminals with one of the plurality of switching circuits interposed therebetween. Specifically, the input terminal TX1 is connected to the output terminals ANT1 to ANT3 through the channels L1 to L3. The input terminal TX2 is connected to the output terminals ANT1 to ANT3 through the channels L4 to L6. The input terminal TX3 is connected to the output terminals ANT1 to ANT3 through the channels L7 to L9.

In the above-described configuration, the switching device 100 transmits a transmission signal inputted from each of the input terminals TX1 to TX3 to one of the output terminals ANT1 to ANT3 while switching the route in response to a control signal supplied from the control circuit Cont in accordance with, for example, the modes and the bands. Although all of the combinations of each of the input terminals TX1 to TX3 and each of the output terminals ANT1 to ANT3 are connected in the example illustrated in FIG. 1, not all of the combinations may be connected. In the present application, the case where "terminals are electrically connected" indicates a case where the terminals are connected with a switching circuit interposed therebetween and indicates a case where a channel between the terminals is switched between conduction and nonconduction by operations of the switching circuit. Accordingly, the case where "terminals are electrically connected" also includes a case that has a period for which the channel between the terminals is nonconducting because the switching circuit is in an off state.

Figure 2:
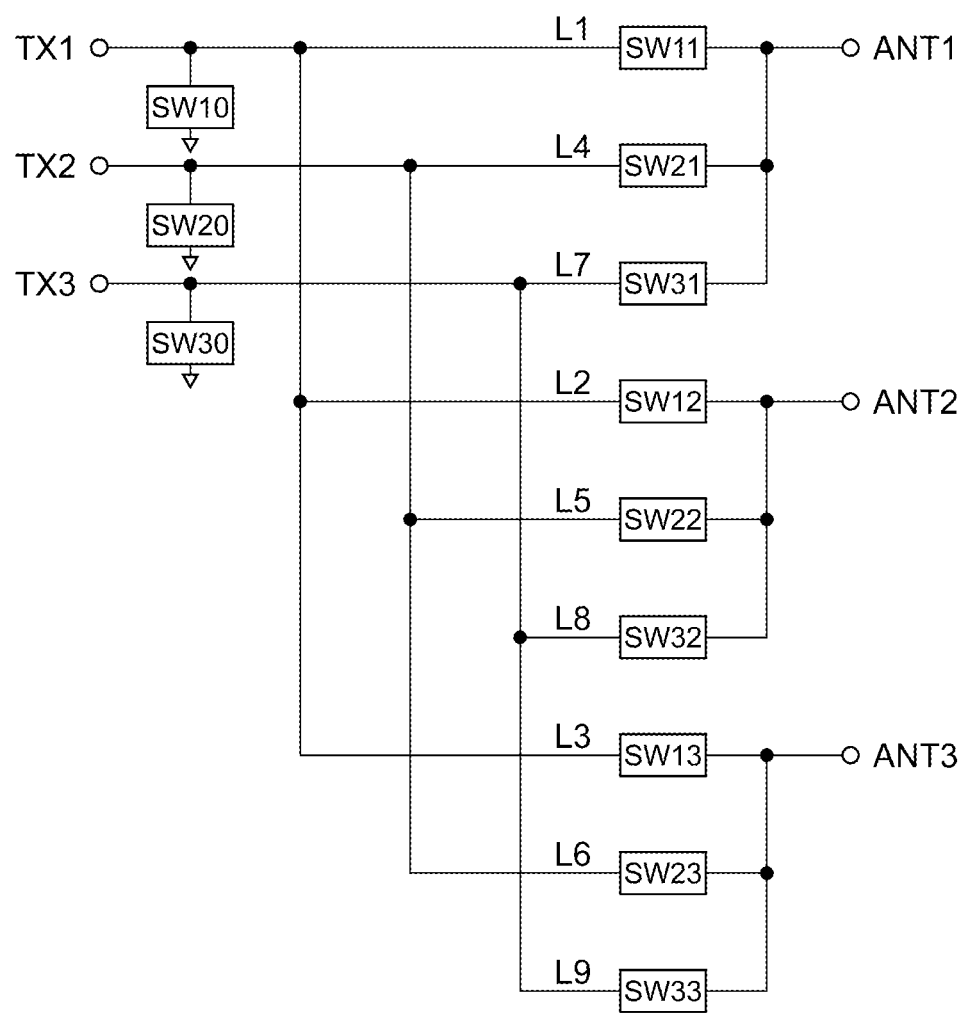
FIG. 2 is a circuit diagram that illustrates channels and switching circuits in the switching device according to the embodiment of the present disclosure.

FIG. 2 is a circuit diagram that illustrates the channels and switching circuits in the switching device according to the embodiment of the present disclosure. As illustrated in FIG. 2, the switching device 100 includes switching circuits SW11 to SW13, SW21 to SW23, and SW31 to SW33 connected in series with the channels L1 to L9, respectively, and switching circuits SW10, SW20, and SW30 connected in shunt with the channels L1 to L9. Specifically, the switching circuit SW11 controls the connection between the input terminal TX1 and output terminal ANT1, the switching circuit SW12 controls the connection between the input terminal TX1 and output terminal ANT2, and the switching circuit SW13 controls the connection between the input terminal TX1 and output terminal ANT3. The switching circuits SW21 to SW23 and SW31 to SW33 perform controlling similarly. The switching circuits SW10, SW20, and SW30 cause signals to flow through the channels L1 to L9 in their off states, and produce an impedance mismatch and interrupt signals by causing the impedance to approach 0 Ω (short circuit) in their on states.

The detailed description about the configuration of the 12 switching circuits SW10 to SW13, SW20 to SW23, and SW30 to SW33 is omitted. The switching circuits may be configured by using, for example, metal-oxide-semiconductor field-effect transistors (MOSFETs).

Figure 3:
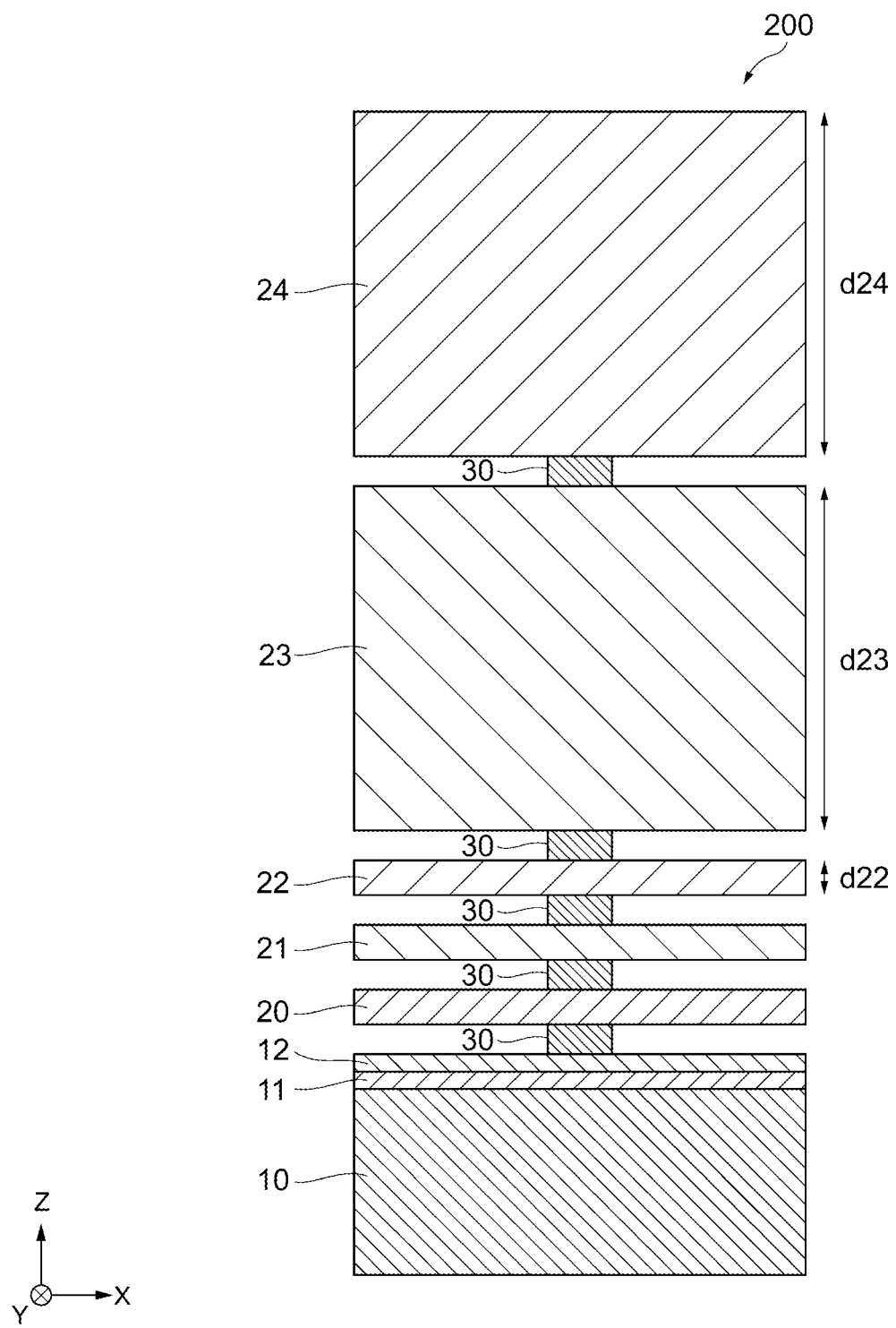
FIG. 3 is a cross-sectional view of a semiconductor chip in which the switching device according to the embodiment of the present disclosure is disposed.

FIG. 3 is a cross-sectional view of a semiconductor chip in which the switching device according to the embodiment is disposed. A semiconductor chip 200 includes a substrate 10 having a principal surface parallel with an XY plane and a thickness parallel with the Z-axis direction. The semiconductor chip 200 further includes an oxide film 11, a silicon thin film 12, and metal layers 20 to 24 laminated in sequence on or above the principal surface of the substrate 10 in the positive Z-axis direction. In the semiconductor chip 200, the devices (e.g., switching circuits SW10 to SW13, SW20 to SW23, and SW30 to SW33) are disposed on the silicon thin film 12, and these devices are electrically connected by wires disposed on the metal layers 20 to 24. The metal layers 20 to 24 are electrically connected by a via electrode 30. The input terminals and output terminals may be connected to a mounting substrate (not illustrated) on which the semiconductor chip 200 is mounted by, for example, wire-bonding, and the input terminals and the output terminals are electrically connected to the transmission circuits and the antennas, respectively. Each of the thicknesses d23 and d24 of the metal layers 23 and 24, which are laminated on an upper side (positive Z-axis direction side), is larger than the thickness d22 of the metal layer 22, which is laminated on a lower side (negative Z-axis direction side). An example of the thickness d22 of the metal layer 22 may be on the order of 0.4 µm, and an example of each of the thicknesses d23 and d24 of metal layers 23 and 24 may be on the order of 3 µm.

FIG. 4 schematically illustrates an example of a layout of the switching device according to the embodiment of the present disclosure. FIG. 4 illustrates a positional relationship of components when the principal surface of the substrate 10 is seen in a plan view and depicts components disposed on different layers on the same plane.

The three input terminals TX1 to TX3, three output terminals ANT1 to ANT3, and 12 switching circuits SW10 to SW13, SW20 to SW23, and SW30 to SW33 are arranged as illustrated in FIG. 4 in a plan view of the semiconductor chip 200. The components are electrically connected by the channels L1 to L9. Here, the multiple-input multiple-output switching device may have an intersection area where channels intersect. In an example illustrated in FIG. 4, for example, the channel L2 (first channel) connecting the input terminal TX1 and output terminal ANT2 and the channel L4 (second channel) connecting the input terminal TX2 and output terminal ANT1 intersect with each other in an intersection area R. In this intersection area, if the wires of the channels are disposed on neighboring layers illustrated in FIG. 3 (e.g., metal layers 23 and 24), a parasitic capacitance occurring between these metal layers causes signals flowing through the wire on one metal layer to leak to the wire on the other metal layer. Thus, electric power of the signals flowing through the intersecting channels L2 and L4 particularly decreases, and this leads to an increase in insertion loss in the switching device.

In the switching device 100, unlike in the above-described case, the wire constituting the channel L2 and the wire constituting the channel L4 are disposed on the metal layers spaced away from each other in the intersection area R. Specifically, for example, the wire constituting the channel L2 is disposed on the metal layer 22 (first layer), and the wire constituting the channel L4 is disposed on the metal layer 24 (third layer). That is, the metal layer 23 (second layer), on which none of the plurality of the wires constituting the channels L1 to L9 is disposed, exists between the metal layers 22 and 24. Thus, the effect of the parasitic capacitance occurring between the metal layers is suppressed, and the decrease in the electric power of the signals flowing through the intersecting channels is suppressed. Accordingly, the increase in the insertion loss in the switching device 100 can be suppressed.

Not all of the portions of the wires from the input terminals to the output terminals of the channels L2 and L4 may be disposed on the metal layers 22 and 24. The wires of these channels in the intersection area R are disposed on the metal layers 22 and 24, but the wires in the other area may be disposed on a metal layer different from them. Also, some portions of the wires constituting the channels L1 to L9 may be disposed on the metal layer 23. The wires of these channels in the intersection area R are not disposed on the metal layers 23, but the wires in the other area may be disposed on a metal layer 23.

The metal layer on which the wire of the channel L2, which extends on the lower side, is not particularly limited to the metal layer 22. If that wire is disposed on, for example, the metal layer 21 or 20, however, because the metal layers 21 and 20 are closer to the substrate 10 than the metal layer 22, the distance to the ground electrode is reduced, and this also leads to a decrease in the electric power of signals. Accordingly, the channel L2, which extends on the lower side, may preferably be disposed on the metal layer 22, which is adjacent to neither the metal layer 24, on which the wire of the channel L4 extending on the upper side is disposed, nor the metal layer 20, which is closer to the substrate 10 than the other metal layers included in the semiconductor chip 200.

The components of the switching device 100 are arranged such that the number of intersection areas where the channels L1 to L9 intersect is minimized. In the example illustrated in FIG. 4, for example, the channels L2 and L4 intersect with each other, the other channels do not intersect, and thus, only one intersection area R is present. In this case, the increase in insertion loss can be further suppressed, in comparison with a configuration in which a plurality of intersection areas are present. As in this configuration, when the switching device is a three-input three-output switch, the number of intersection areas can be reduced to one.

The wires of the channels L1 to L9, except for the wires in the above-described intersection area R, may be disposed on the metal layer 23 or 24, both of which are relatively thick among all of the metal layers included in the semiconductor chip 200. In this case, the width of each of the wires constituting the channels can be large. Accordingly, phenomena in which a metal constituting a wire moves on an insulating material (electrochemical migration phenomena) can be suppressed, and yield of the switching device can be improved.

Figure 5A:
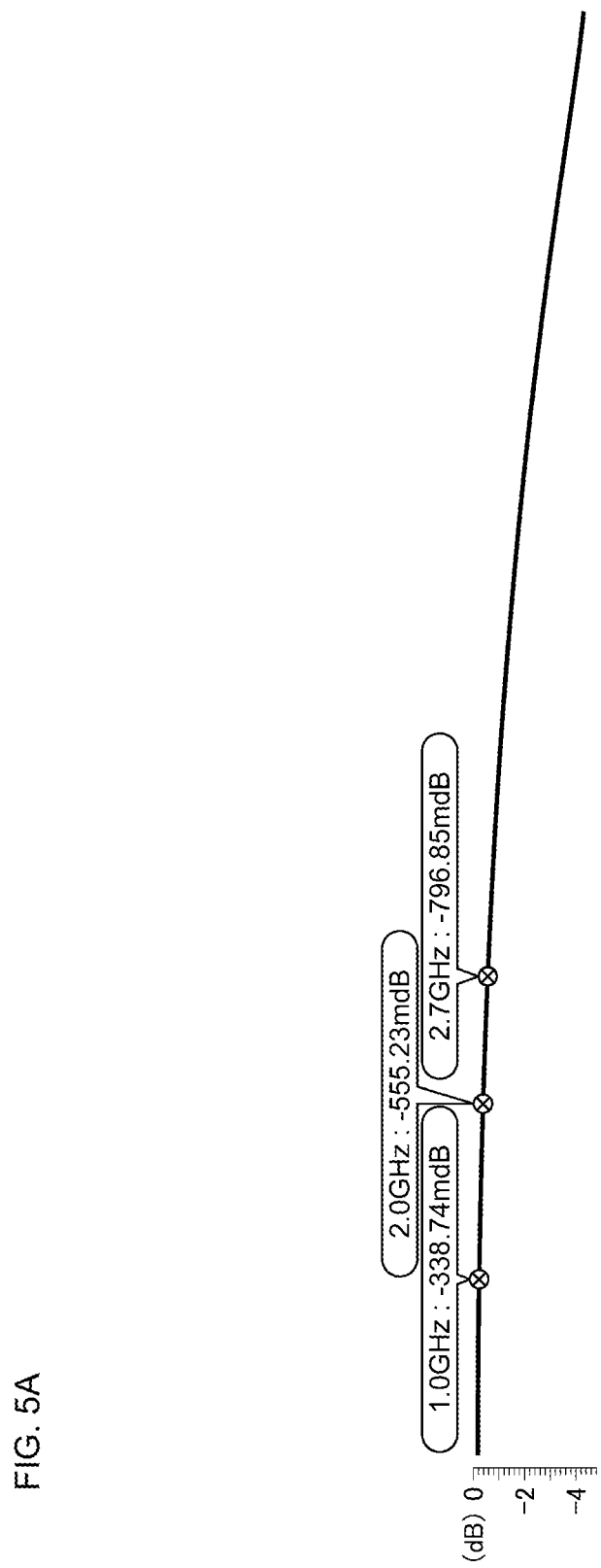
FIG. 5A is a graph that illustrates an example of a result of simulation of insertion loss according to a comparative example.
Figure 5B:
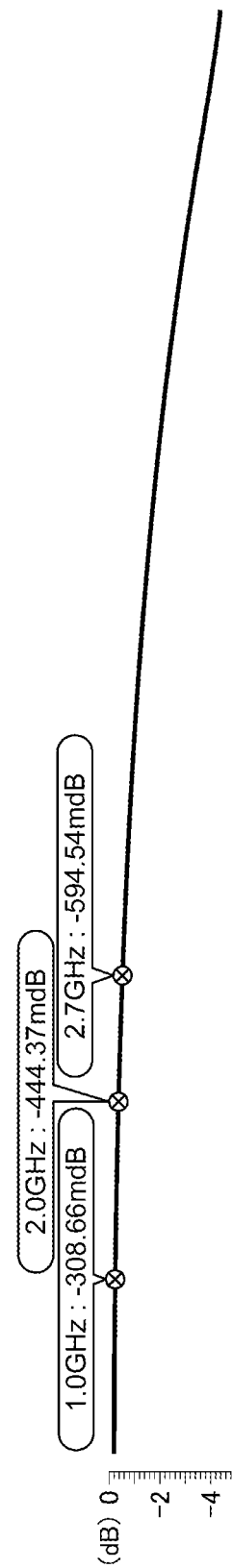
FIG. 5B is a graph that illustrates an example of a result of simulation of insertion loss in the switching device according to the embodiment of the present disclosure.

Next, the results of the simulation of insertion loss in the switching device 100 are described with reference to FIGS. 5A and 5B. FIG. 5A is a graph that illustrates an example of a result of simulation of insertion loss according to a comparative example. FIG. 5B is a graph that illustrates an example of a result of simulation of insertion loss in the switching device according to the embodiment of the present disclosure. FIGS. 5A and 5B illustrate the insertion loss (dB) in the channel L4 when the channels L2 and L4 intersect with each other. Here, the comparative example is a configuration in which the channel L2 is disposed on the metal layer 22 and the channel L4 is disposed on the metal layer 23, whereas the present embodiment is a configuration in which the channel L2 is disposed on the metal layer 22 and the channel L4 is disposed on the metal layer 24. The insertion loss illustrated in FIGS. 5A and 5B is shown in Table 1.

TABLE 1

| | Frequency | | |
|---|---|---|---|
| | 1.0 GHz | 2.0 GHz | 2.7 GHz |
| Comparative Example (mdB) | −338.74 | −555.23 | −796.85 |
| Present Embodiment (mdB) | −308.66 | −444.37 | −594.54 |

As shown in Table 1, when the signal frequency is 2.7 GHz, for example, the insertion loss in the comparative example is approximately −0.79 dB, and that in the present embodiment is approximately −0.59 dB. That is, it is revealed that the insertion loss in the switching device 100 is improved by about 0.2 dB, in comparison with the comparative example. The results also reveal that the increase in insertion loss in the switching device 100 is suppressed by disposing the intersecting channels on the metal layers remote from each other.

The embodiment illustrative of the present disclosure is described above. In the switching device 100, in the intersection area R, where the channels L2 and L4 intersect with each other, the metal layer 23, where none of the plurality of the channels is disposed, exists between the metal layer 22, where the one intersecting channel L2 is disposed, and the metal layer 24, where the other intersecting channel L4 is disposed. Thus, the effect of a parasitic capacitance occurring between the metal layers is suppressed, and the decrease in electric power of signals flowing through the intersecting channels is suppressed. Accordingly, the increase in insertion loss in the switching device 100 can be suppressed.

The switching device 100 has only one intersection area R, where a plurality of channels intersect. Thus, it can further suppress the increase in insertion loss, in comparison with the configuration having a plurality of intersection areas.

One example of the switching device 100 may be, but not limited to, a three-input three-output switch. In this switch, the number of the intersection areas R can be reduced to one.

The above-described embodiment is intended to facilitate the understanding of the present disclosure and is not intended to restrict the interpretation of the present disclosure. The present disclosure can be changed or improved without departing from the spirit thereof and includes equivalents thereto. That is, configurations in which those skilled in the art make design changes to the embodiment as appropriate are also included in the scope of the present disclosure as long as they have characteristics of the present disclosure. For example, arrangements, materials, conditions, shapes, and sizes of the components in the embodiments are not limited to the illustrated ones and may be changed as appropriate. The components in the embodiment can be combined in a technically possible manner, and configurations in which the components are combined are also included in the scope of the present disclosure as long as they have characteristics of the present disclosure.

100 switching device
200 semiconductor chip
TX1 to TX3 input terminals
ANT1 to ANT3 output terminals
L1 to L9 channels
Cont control circuit SW10 to SW13, SW20 to SW23, SW30 to SW33 switching circuits
  10 substrate
  11 oxide film
  12 silicon thin film
  20 to 24 metal layers
  30 via electrode

The invention claimed is:

1. A switching device comprising:
- a plurality of layers including first to third layers laminated in sequence on or above a principal surface of a substrate;
- a plurality of input terminals;
- a plurality of output terminals;
- a plurality of switching circuits; and
- a plurality of channels, each of the channels electrically connecting one of the plurality of input terminals and one of the plurality of output terminals via one of the plurality of switching circuits,
- wherein the plurality of channels include a first channel and a second channel intersecting with each other when the principal surface of the substrate is seen in a plan view,
- in an intersection area where the first and second channels intersect with each other, the first channel is disposed on the first layer, the second channel is disposed on the third layer, and none of the plurality of channels is disposed on the second layer, and
- the first channel is disposed on a layer, which is adjacent to neither a layer on which the second channel is disposed nor a layer which is closest to the substrate, among the plurality of layers.

2. The switching device according to claim 1, wherein a there is only one intersection area as the intersection area.

3. The switching device according to claim 2, wherein a number of the plurality of input terminals is three,
- a number of the plurality of output terminals is three,
- a number of the plurality of channels is nine, and
- each of the plurality of input terminals and each of the plurality of output terminals are electrically connected.

4. The switching device according to claim 1, wherein at least two of the plurality of layers have different thickness from each other, wherein
- the plurality of channels are disposed on relatively thick layers among the plurality of the layers, except in the intersection area.

5. The switching device according to claim 1, wherein at least two of the plurality of layers have different thickness from each other, wherein the first layer is a layer which is the thickest among the plurality of the layers.

* * * * *